(12) United States Patent
Clevenger et al.

(10) Patent No.: US 7,439,172 B2
(45) Date of Patent: Oct. 21, 2008

(54) CIRCUIT STRUCTURE WITH LOW DIELECTRIC CONSTANT REGIONS AND METHOD OF FORMING SAME

(75) Inventors: Lawrence A. Clevenger, LaGrangeville, NY (US); Matthew E. Colburn, Hopewell Junction, NY (US); Louis C. Hsu, Fishkill, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 11/623,478

(22) Filed: Jan. 16, 2007

(65) Prior Publication Data

US 2008/0171432 A1    Jul. 17, 2008

(51) Int. Cl.
*H01L 21/4763* (2006.01)
(52) U.S. Cl. .............................. 438/619; 257/E21.581
(58) Field of Classification Search ................... 438/619
See application file for complete search history.

(56) References Cited

U.S. PATENT DOCUMENTS

| 5,444,015 | A | 8/1995 | Aitken et al. |
| 6,013,536 | A | 1/2000 | Nowak et al. |
| 6,057,224 | A | 5/2000 | Bothra et al. |
| 6,228,763 | B1 | 5/2001 | Lee et al. |
| 6,329,279 | B1 | 12/2001 | Lee et al. |
| 7,361,991 | B2 * | 4/2008 | Saenger et al. ............... 257/750 |
| 2003/0042612 | A1 * | 3/2003 | Leuschner et al. .......... 257/759 |
| 2005/0037585 | A1 | 2/2005 | Park et al. |

OTHER PUBLICATIONS

U.S. Appl. No. 11/670,524, filed Fanuary 2, 2007 titled Microelectronic Circuit Structure with Layered Low Dielectric Constant Regions and Method of Forming Same of Clevenger et al.

* cited by examiner

*Primary Examiner*—Lex Malsawma
*Assistant Examiner*—Kimberly Trice
(74) *Attorney, Agent, or Firm*—Ryan, Mason & Lewis, LLP; Daniel P. Morris, Esq.

(57) ABSTRACT

A method for manufacturing a circuit includes the step of providing a first wiring level comprising first wiring level conductors separated by a first wiring level dielectric material. A first dielectric layer with a plurality of interconnect openings and a plurality of gap openings is formed above the first wiring level. The interconnect openings and the gap openings are pinched off with a pinching dielectric material to form relatively low dielectric constant (low-k) volumes in the gap openings. Metallic conductors comprising second wiring level conductors and interconnects to the first wiring level conductors are formed at the interconnect openings while maintaining the relatively low-k volumes in the gap openings. The gap openings with the relatively low-k volumes reduce parasitic capacitance between adjacent conductor structures formed by the conductors and interconnects.

19 Claims, 4 Drawing Sheets

POST Vx RIE

GAP FILL WITH CVD

TRENCH LITHO

TRENCH ETCH

METALLIZATION

CMP

CIRCUIT STRUCTURE WITH LOW DIELECTRIC CONSTANT REGIONS AND METHOD OF FORMING SAME

FIELD OF THE INVENTION

The present invention generally relates to the electrical and electronic arts and, more particularly, to circuit structures and their formation.

BACKGROUND OF THE INVENTION

To minimize the back-end-of-line (BEOL) interconnect portion of circuit delay, the conventional $SiO_2$ dielectric (dielectric constant, k~4.0) has been replaced with dense lower-k films (k<3.0). For further performance improvement, more parasitic capacitance reduction is required (k<2.5) for high-speed circuits.

Lowering parasitic capacitance can be achieved with new porous low k dielectrics, however most of the porous materials have relatively weak mechanical properties as compared to dense dielectrics. It is also difficult to integrate these materials with other BEOL module processes. For example, the conventional chemical-mechanical polish process has difficulty in polishing porous dielectric, and the conventional physical vapor deposition (PVD) diffusion barrier deposition technology cannot offer reasonable coverage on the surface of porous dielectrics.

Current art references directed to forming air dielectrics for microelectronic applications do not set forth techniques that can be employed in practical manufacturing processes. U.S. Pat. No. 6,057,224 discloses methods for making semiconductor devices having air dielectric interconnect structures. A method of making an integrated circuit interconnect structure having air as the effective dielectric between metallization layers includes the steps of: a) providing an air dielectric formation layer of a sacrificial material over a substrate; b) forming a pillar holes in the air dielectric formation layer; c) filling the pillar holes with a non-sacrificial material; d) constructing a metallization layer over the sacrificial air dielectric formation layer, and non-sacrificial material pillars; and e) applying an isotropic etchant to the interconnect structure to remove the sacrificial material, leaving the non-sacrificial material pillars for mechanical support of the metallization layer. An interconnect structure having an air dielectric includes a bottom metallization layer; a top metallization layer, and a plurality of pillars separating the bottom and top metallization layers and mechanically supporting the top metallization layer. Additional similar interconnect structures can be stacked over a base interconnect structure.

U.S. Pat. No. 6,013,536 discloses an apparatus for automated pillar layout and method for implementing same. Disclosed is a method for automating support pillar design in air dielectric interconnect structures. The method includes selecting features having an interconnect dimension from a first mask. Providing an intermediate support pattern defining a pillar spacing. Identifying overlap regions where the features selected from the first mask overlap the intermediate support pattern. The method further including filtering the overlap regions to eliminate features that ale less than the interconnect dimension. The filtering being configured to define discrete pillar locations associated with the first mask.

The foregoing suggests removing a sacrificial material using pillars to form support on a semiconductor chip. The resulting structure is very unstable and cannot sustain any mechanical stress. For example, the structure cannot be further processed by employing a chemical-mechanical polishing process. It is not compatible with any existing packaging methodology. Randomly removing dielectric substances and replacing them with air cannot be implemented in the current manufacturing environment. Trapping of residual chemicals will cause yield and reliability failure, and the weak structure literally cannot protect the metallization levels of the chip.

U.S. Pat. No. 6,228,763 discloses a method of fabricating metal interconnect having inner air spacer. U.S. Pat. No. 6,329,279 discloses a method of fabricating metal interconnect having outer air spacer. US Patent Application Publication 2005/0037585 discloses a semiconductor device including air gap between semiconductor substrate and L-shaped spacer and method of fabricating the same.

A paper by L. G. Gosset et al., entitled "Integration of SiOC air gaps in copper interconnects," Microelectronics Engineering 70 (2003), pp. 274-279, teaches another approach in which an extra lithography and extra etch step are utilized to generate an air gap. The added complexity increase costs and subjects the process to significantly increased process time per metal level.

Accordingly, it would be desirable to overcome the limitations of prior art approaches.

SUMMARY OF THE INVENTION

Principles of the present invention provide techniques for forming circuit structures with low dielectric constant regions. An exemplary embodiment of a method for manufacturing a circuit, according to one aspect of the invention, includes the step of providing a first wiring level comprising first wiring level conductors separated by a first wiring level dielectric material. Further, a first dielectric layer of first dielectric layer material is formed above the first wiring level, the first dielectric layer having a plurality of interconnect openings and a plurality of gap openings. The interconnect openings and the gap openings are pinched off with a pinching dielectric material to form relatively low dielectric constant (low-k) volumes in the gap openings. Metallic conductors comprising second wiring level conductors, and interconnects are formed at the interconnect openings while maintaining the relatively low-k volumes in the gap openings. The first wiring level conductors, the second wiring level conductors, and the interconnects form a series of conductor structures. The gap openings with the relatively low-k volumes reduce parasitic capacitance between adjacent ones of the conductor structures as compared to an otherwise comparable circuit not including the gap openings with the relatively low-k volumes.

In another aspect, an inventive electrical circuit structure, comprises at least two generally parallel conductor structures, a solid dielectric material generally interposed between the at least two generally parallel conductor structures, and a plurality of relatively low dielectric constant (low-k) volumes sealed within the solid dielectric material between the at least two generally parallel conductor structures. The relatively low-k volumes reduce parasitic capacitance between the at least two generally parallel conductor structures as compared to an otherwise comparable circuit not including the relatively low-k volumes.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
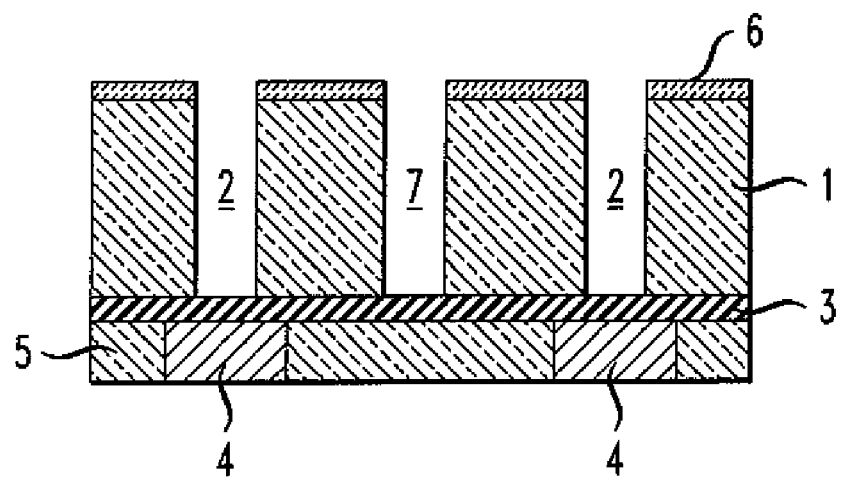
FIGS. 1-6 show steps in an exemplary method according to one aspect of the invention, FIG. 6 also showing a cross-section of an exemplary inventive circuit structure.

An exemplary method of manufacturing a circuit (such as a microelectronic circuit) will now be described with respect to the figures, in which like reference characters are used throughout to refer to like elements, unless otherwise noted. With reference to FIG. 1, which is a cross-sectional view (as are FIGS. 1-6), one step of the method includes providing a first wiring level comprising first wiring level conductors 4 separated by a first wiring level dielectric material 5. A first dielectric layer 1 of first dielectric layer material is formed above the first wiring level, the first dielectric layer 1 having a plurality of interconnect openings 2 and a plurality of gap openings 7. Optionally, a capping layer 3 can be formed over the first wiring level prior to forming the first dielectric layer, and also, a capping layer 6 can optionally be formed over the first dielectric level. Note that interconnect openings 2 are formed over conductors 4, while gap openings 7 are not. The notation "Post Vx RIE" is employed to indicate the starting point in providing the first wiring level with performance of the other steps set forth in this paragraph.

In one or more embodiments, the plurality of interconnect openings 2 and the plurality of gap openings 7 are formed substantially simultaneously. Openings 2 and 7 can be formed, for example, by patterning and etching the first dielectric layer 1. The interconnect openings 2 can have a polygonal cross-section when viewed end-on (that is, from above layer 6 in FIG. 1). A polygonal cross-section includes a circular cross-section, as a circle is a polygon with an infinite number of infinitesimally short sides. Thus, in one or more embodiments, the interconnect openings comprise via interconnect openings having a generally circular cross-section. As is known to the skilled artisan, "vias" are inter-level conductive connections that typically have a circular cross section. The gap openings 7 can also have a polygonal cross-section.

By way of review, FIG. 1 shows an exemplary process step wherein a new level is patterned over an existing interconnect structure which includes a metal line 4, a dielectric 5, and a diffusion barrier and electromigration barrier 3. In this step, a pattern which contains an interconnect layout 2 and a gap layout 7 is printed and etched though a dielectric stack which contains both material 1 and material 6. Material 1 can be, for example, SiCOH; SiLK® (Registered trademark of DOW Chemical Co, Midland, Mich., USA) sealing and protective interlayer dielectric coating for use in computer disk drives, integrated circuits, and other computer hardware, software, or firmware; $SiO_2$; $Si_3N_4$; and the like. Japan Synthetic Rubber (JSR) also makes suitable materials known, per se, to the skilled artisan. Barrier 3 can be, for example, SiC(N,H); $SiO_2$; $Si_3N_4$; CoWP, and the like. Metal line 4 can be, for example, Cu, Al, Cu(Al), W, and the like. Material 5 can be, for example, SiCOH; SiLK® dielectric coating; JSR; $SiO_2$; $Si_3N_4$; and the like. Material 6 can be, for example, SiC(N,H); $SiO_2$; $Si_3N_4$; CoWP, and the like.

Figure 2:
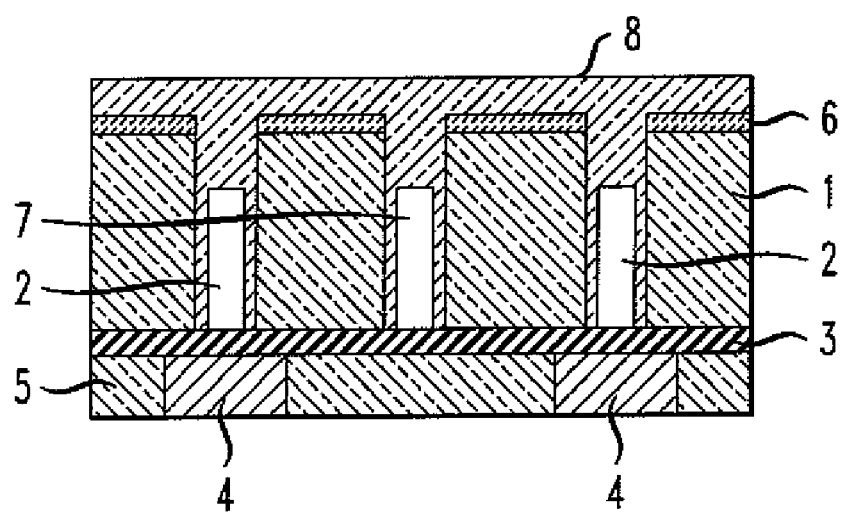

The interconnect openings 2 and the gap openings 7 are pinched off with a pinching dielectric material 8, as shown in FIG. 2, to form relatively low dielectric constant (low-k) volumes in the gap openings 7. The relatively low-k volumes can have, for example, a dielectric constant of from about 1 to about 1.1. This pinching can be accomplished, for example, by inorganic chemical vapor deposition (CVD) of ultra-low-dielectric-constant material (ULK) (K ranging from about 2.0 to about 2.7), SiCOH, or the like. The pinching off step results in the pinched-off structure shown in FIG. 2. Material 8 may coat the sides of gaps 2, 7, but does not fill the gaps. In addition to ULK and SiCOH, in general terms, the pinching dielectric material can be an inorganic dielectric, such as a compound of at least one of silicon, oxygen, carbon, hydrogen, nitrogen, boron, and sulfur. The skilled artisan will appreciate that some members of the class of inorganic dielectrics have some carbon (for example, silsesquioxane). In other embodiments, the pinching dielectric material can be an organic dielectric, such as polyparylene ether, diamond-like carbon (deposited, for example, by chemical vapor deposition (CVD)), and a spin-coated organic dielectric, such as SiLK® dielectric coating. Techniques familiar to the skilled artisan, that can be employed with the teachings herein, are given for example, in Loke et al, *Kinetics of Copper Drift in PECVD Dielectrics*, IEEE Electron Device Letters 17:12 (December 1996) and Kawahara et al., *Highly thermal-stable, plasma-polymerized BCB polymer film*, Plasma Sources Sci. Technol 12 (2003) S80-S88. The pinching dielectric material need not be the same as the dielectric material forming layers 1 or 5 (layers 1 and 5 can also be different, if desired). In one or more embodiments, however, the same dielectric material can be used. FIG. 2 thus depicts an exemplary pinch-off process in which a dielectric material 8 is deposited over the structure and pinches off the gaps 2 and 7.

Figure 3:
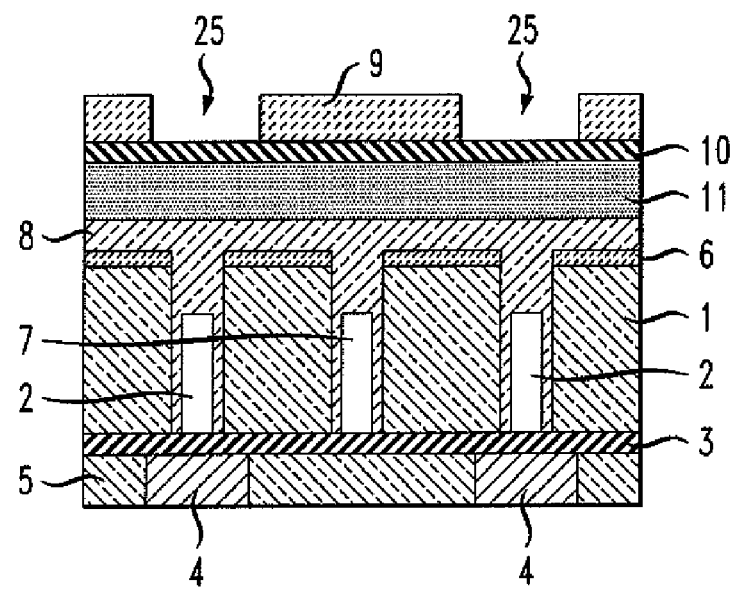
Figure 4:
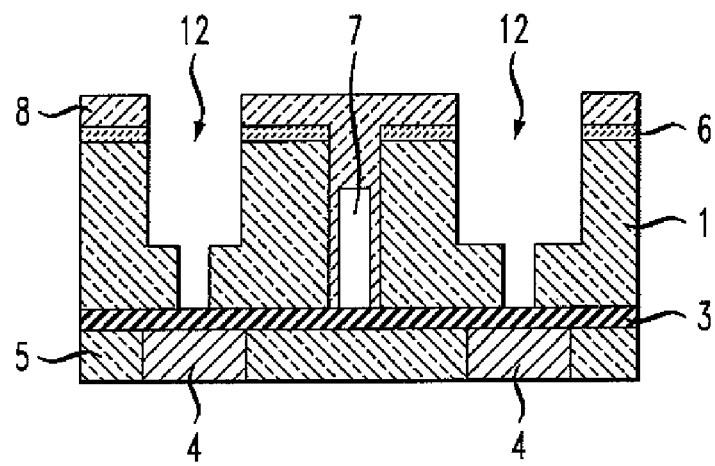
Figure 5:
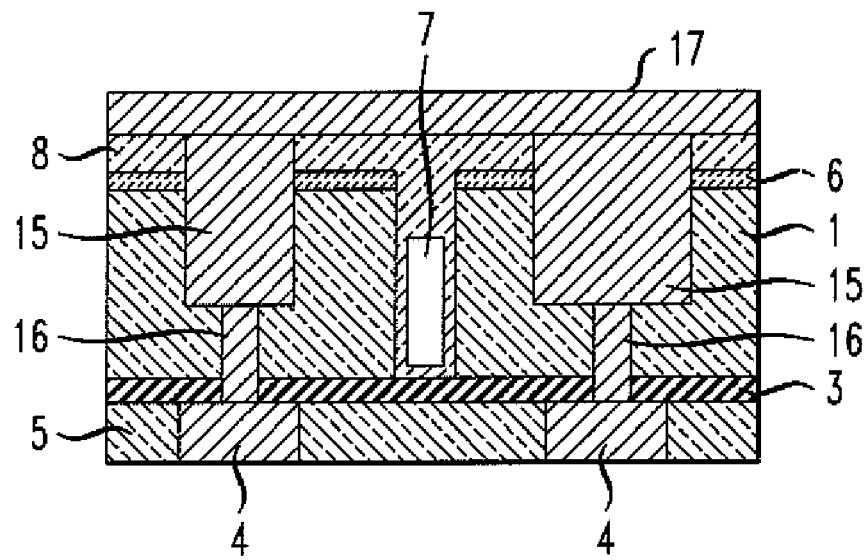

FIGS. 3-5 show, in general terms, one specific manner of forming metallic conductors 5 comprising second wiring level conductors 15, and interconnects 16 at the interconnect openings 2 while maintaining the relatively low-k volumes in the gap openings 7. The first wiring level conductors 4, the second wiring level conductors 15, and the interconnects 16 form a series of conductor structures having the "I-beam-like" cross section shown in FIGS. 5 and 6. The gap openings 7 with the relatively low-k volumes therein reduce parasitic capacitance between adjacent ones of the conductor structures, as compared to an otherwise comparable circuit not including the gap openings with the relatively low-k volumes. An "otherwise comparable" circuit contemplates the case of a circuit having all similar materials and dimensions, except for the low-k volumes. Of course, parasitic capacitance is only reduced where the low-k volumes have a lower k than the (solid) dielectric material 1, but this is the case with current circuit fabrication technologies.

In FIG. 3, trench lithography is employed to form a layer substantially resistant to etching over the pinched-off structure, the etching-resistant layer having gaps 25 over the interconnect openings 2. The layer substantially resistant to etching can be formed, for example, using an antireflective coating 10 of organic or inorganic materials, and an under-layer coating 11, of for example, an organic material. A spin-on photo imaging layer 9 can be provided, for example, positive or negative photoresist. FIG. 3 thus shows the patterning of the trench layer in which a trench level pattern is printed in a resist 9 over a stack which includes a planarization layer 11 and an antireflective coating 10. The trench 9 aligns to the gaps 2 and protects the gap 7.

Figure 6:
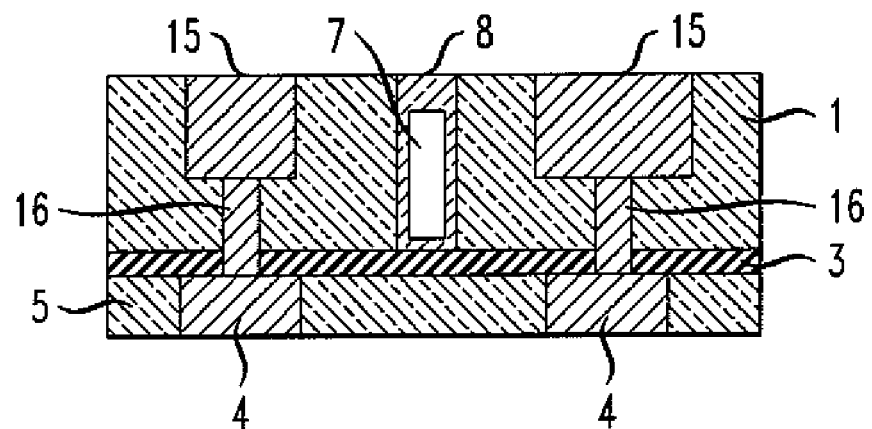

Trenches 12 are etched at the interconnect openings 2 to form the etched structure depicted in FIG. 4. FIG. 4 shows the post-etch transfer structure in which trench 12 is open and (almost) ready for plating (the barrier layer 3 is not open yet, therefore before metal deposition, one must remove the barrier layer 3). The gap 7 remains protected. The etched structure is metallized to produce the metallized etched structure depicted in FIG. 5, comprising second wiring level conductors 15 and interconnects 16 (In other words, the etched structure is filled with metallic materials using one of the metal deposition processes such as CVD, plating, sputtering, etc.). The metallization can extend over the top of the structure, as shown at 17, and can be performed, for example, by plating. FIG. 5 thus shows the structure plated with the metal, forming elements 15, 16 and 17. FIG. 6 shows the structure of FIG. 5 after polishing; note that the gap 7 remains intact.

As shown in FIG. 6, the metallized etched structure can be planarized, for example, by chemical-mechanical polishing (CMP), so as to reduce the thickness of the second wiring level conductors 15.

Figure 7:
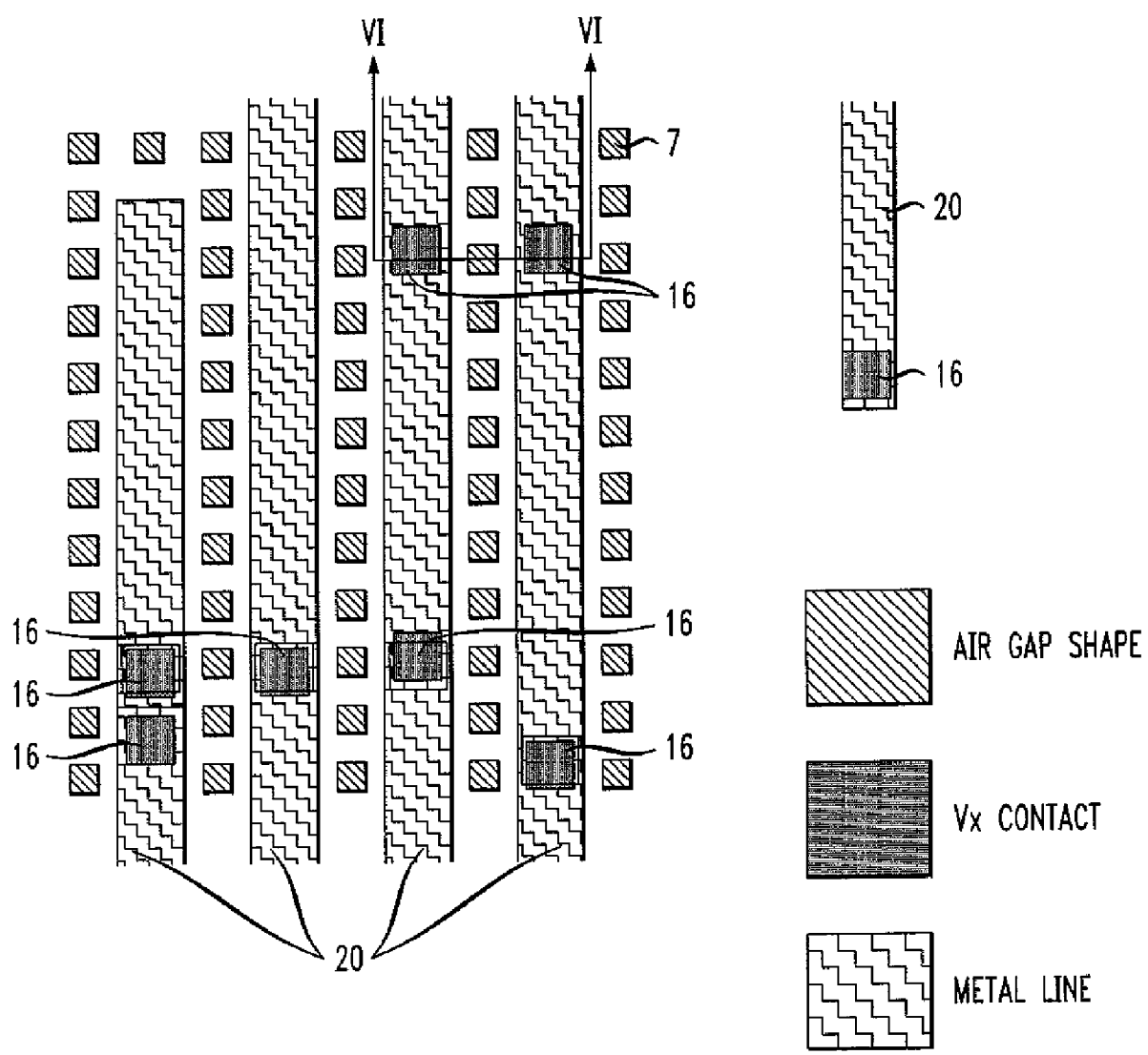
FIG. 7 shows a top view of the exemplary inventive circuit structure.

FIG. 6 shows a cross section, and FIG. 7 a top plan view, of a resulting exemplary inventive electrical circuit structure, according to an aspect of the invention. FIG. 6 is a cross-section along cutting plane line VI-VI of FIG. 7. Included are at least two generally parallel conductor structures 20, formed by elements 4, 15 and 16 of FIG. 6. A solid dielectric material 1 is generally interposed between the at least two generally parallel conductor structures 20. A plurality of relatively low dielectric constant (low-k) volumes 7 are sealed within the solid dielectric material 1 between the at least two generally parallel conductor structures 20. The relatively low-k volumes 7 reduce parasitic capacitance between the at least two generally parallel conductor structures 20 as compared to an otherwise comparable circuit not including the relatively low-k volumes 7. While labeled as "air gaps," volumes 7 can employ a number of strategies to obtain the low-k volumes, as discussed above. For example, in one or more embodiments, the relatively low dielectric constant (low-k) volumes 7 contain substantially gaseous material trapped during the pinching-off process, including but not limited to air. In one or more embodiments, the pinching can be performed in a vacuum; a pressure of for example, 1 torr, 10 mtorr, or even an ultra high vacuum of 10-9 torr might be possible (although the latter might be challenging to obtain). The skilled artisan will appreciate that even an ultra high vacuum contains some gaseous material. The at least two generally parallel conductor structures 20 (in the same plane as the dielectric material stack) can comprise metallized dual-damascened via line structures. In some embodiments, the two parallel structures 20 comprise a transmission line. Interconnects 16 are in the form of Vx contacts in the example shown in FIG. 7.

Elements 4 and 15 are preferably continuous in and out of the page in FIG. 6, but need not be, depending on the application. Interconnects 16 are preferably not continuous in and out of the page, but are localized structures providing structural support for elements 15 and electrical and thermal conduction between elements 4 and 15.

One or more embodiments of the invention provide a process of producing air-bridge structures (or other low-k volumes) in circuits such as Very-Large Scale Integrated (VLSI) and Ultra-Large Scale Integrated (ULSI) devices and high performance packaging. In particular, one or more embodiments provide a process for copper Interconnects that circumvents problems associated with prior art techniques. One or more embodiments of the invention mitigate process steps and do not rely on exotic or new materials, and can provide capacitance improvement for interconnect devices by using an air gap structure (or other low-k volume) inside the inter-level dielectric, while minimizing the addition of process steps.

One or more embodiments of the invention relate to the generation of an extremely low k interconnect structure comprising a conductor that is encased in a dielectric layer, having supports placed vertically beneath the entire line (e.g., interconnects 16), and a gap 7 in the dielectric layer that is positioned between the metal lines 20. The supports provide one or more pertinent functions, such as, for example, mechanical support beneath the metal line 15 during polish, and a thermal pathway for heat to be conducted through the structure. Compared to an equivalent interlayer dielectric, one or more inventive structures have higher thermal conductivity.

The techniques set forth herein can be used to make circuits realized on an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g, by providing a copy of the storage medium storing the design) or electronically (e.g, through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products. The techniques set for the herein can be used for interconnecting the chip on chips or chip stacks for 3D applications, chips on wafers, chips on package or package on package.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of manufacturing a circuit, comprising the steps of:

providing a first wiring level comprising first wiring level conductors separated by a first wiring level dielectric material;

forming a first dielectric layer of first dielectric layer material above said first wiring level, said first dielectric layer having a plurality of interconnect openings and a plurality of gap openings;

pinching off said interconnect openings and said gap openings with a pinching dielectric material to form relatively low dielectric constant (low-k) volumes in said gap openings; and forming:
metallic conductors comprising second wiring level conductors, and interconnects at said interconnect openings while maintaining said relatively low-k volumes in said gap openings, said first wiring level conductors, said second wiring level conductors, and said interconnects forming a series of conductor structures, said gap openings with said relatively low-k volumes reducing parasitic capacitance between adjacent ones of said conductor structures as compared to an otherwise comparable circuit not including said gap openings with said relatively low-k volumes.

2. The method of claim 1, wherein said relatively low-k volumes have a dielectric constant of from about 1 to about 1.1.

3. The method of claim 1, further comprising the additional step of forming a capping layer over said first wiring level prior to forming said first dielectric layer.

4. The method of claim 1, further comprising the additional step of forming a capping layer over said first dielectric level.

5. The method of claim 1, wherein said pinching off step comprises inorganic chemical vapor deposition (CVD).

6. The method of claim 1, wherein:
said pinching off step results in a pinched-off structure; and
said step of forming said second wiring level conductors and said interconnects comprises:
employing trench lithography to form a layer substantially resistant to etching over said pinched-off structure, said etching-resistant layer having gaps over said interconnect openings;
etching trenches at said interconnect openings to form an etched structure; and
metallizing said etched structure to produce a metallized etched structure comprising said second wiring level conductors and said interconnects.

7. The method of claim 6, wherein said metallizing comprises plating.

8. The method of claim 6, wherein said step of forming said second wiring level conductors further comprises planarizing said metallized etched structure so as to reduce a thickness of said second wiring level conductors.

9. The method of claim 8, wherein said planarizing comprises chemical-mechanical polishing (CMP).

10. The method of claim 1, wherein said step of forming said first dielectric layer above said first wiring level comprises forming said plurality of interconnect openings and said plurality of gap openings substantially simultaneously.

11. The method of claim 10, wherein said forming of said plurality of interconnect openings and said plurality of gap openings is conducted by patterning and etching said first dielectric layer.

12. The method of claim 1, wherein said pinching dielectric material comprises an inorganic dielectric.

13. The method of claim 12, wherein said inorganic dielectric comprises a compound of at least one of silicon, oxygen, carbon, hydrogen, nitrogen, boron, and sulfur.

14. The method of claim 1, wherein said pinching dielectric material comprises an organic dielectric.

15. The method of claim 14, wherein said organic dielectric comprises one of polyparylene ether, diamond-like carbon, and a spin-coated organic dielectric.

16. The method of claim 1, wherein said second dielectric material and said pinching dielectric material are different.

17. The method of claim 1, wherein said interconnect openings have a polygonal cross-section.

18. The method of claim 17, wherein said interconnect openings comprise via interconnect openings having a generally circular cross-section.

19. The method of claim 1, wherein said gap openings have a polygonal cross-section.

* * * * *